(12) United States Patent
Izumi

(10) Patent No.: US 7,364,964 B2
(45) Date of Patent: Apr. 29, 2008

(54) METHOD OF FABRICATING AN INTERCONNECTION LAYER ABOVE A FERROELECTRIC CAPACITOR

(75) Inventor: Kazutoshi Izumi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 141 days.

(21) Appl. No.: 11/133,267

(22) Filed: May 20, 2005

(65) Prior Publication Data

US 2006/0121685 A1 Jun. 8, 2006

(30) Foreign Application Priority Data

Dec. 3, 2004 (JP) ............................. 2004-351906

(51) Int. Cl.
*H01L 21/8242* (2006.01)
(52) U.S. Cl. ...................... 438/240; 438/253; 438/396; 438/422; 438/619
(58) Field of Classification Search ................ 438/3, 438/240, 253, 396, 421–42, 619; 257/295, 257/310, 532
See application file for complete search history.

(56) References Cited

U.S. PATENT DOCUMENTS 7,078,242 B2 * 7/2006 Matsuura et al. .............. 438/3
2002/0175145 A1 * 11/2002 Lee et al. ..................... 216/67
2005/0051864 A1 * 3/2005 Lee et al. .................... 257/506
2005/0142895 A1 * 6/2005 Ingle et al. .................. 438/787

FOREIGN PATENT DOCUMENTS

JP 2000-022981 A 1/2000

OTHER PUBLICATIONS

Korean Office Action dated May 8, 2006, issued in corresponding Korean Patent Application No. 2005-0025397.
Patent Abstracts of Japan, Publication No. 10012730 A, published on Jan. 16, 1998.
Patent Abstracts of Japan, Publication No. 09237834 A, published on Sep. 9, 1997.
Patent Abstracts of Japan, Publication No. 02151032 A, published on Jun. 11, 1990.

* cited by examiner

*Primary Examiner*—Mary Wilczewski
*Assistant Examiner*—Toniae M Thomas
(74) *Attorney, Agent, or Firm*—Westerman, Hattori, Daniels & Adrian, LLP.

(57) ABSTRACT

A highly reliable semiconductor device having a ferroelectric capacitor structure by sufficiently preventing the $H_2$ attack without damaging the function of an interlayer insulating film covering interconnections and the like to obtain a high capacitor performance. The position of a semiconductor substrate mounted on and secured to a substrate support plate in an HDP-CVD system is adjusted in the vertical direction, whereby a second HDP-CVD oxide film is deposited so that voids are formed between aluminum interconnections at lower positions than the height of the aluminum interconnections.

12 Claims, 7 Drawing Sheets

METHOD OF FABRICATING AN INTERCONNECTION LAYER ABOVE A FERROELECTRIC CAPACITOR

CROSS-REFERENCE TO RELATED APPLICATIONS

This application is based upon and claims the benefit of priority from the prior Japanese Patent Application No. 2004-351906, filed on Dec. 3, 2004, the entire contents of which are incorporated herein by reference.

BACKGROUND OF THE INVENTION

1. Field of the Invention

The present invention relates to a semiconductor device having a ferroelectric capacitor structure in which a dielectric film comprising a ferroelectric material is sandwiched between a bottom electrode and a top electrode, and to a method of fabricating the same.

2. Description of the Related Art

Flash memories and ferroelectric random access memories (FeRAMs) are conventionally well-known non-volatile memories that can store information without supplying a power.

The flash memory has a floating gate buried in the gate insulating film of an insulated-gate field-effect transistor (IGFET) and stores information as charge on the floating gate. Since the flash memory uses the tunnel current passing through the insulating film to write and erase information, it requires a relatively high voltage.

The FeRAM utilizes ferroelectric hysteresis characteristics to store information. In a ferroelectric capacitor structure having a ferroelectric film as dielectric material sandwiched between a pair of electrodes, the spontaneous polarization is generated according to a voltage applied between the pair of electrodes and preserved even after removing the applied voltage. The polarity of the spontaneous polarization can be inverted by inverting the polarity of the applied voltage, so if the spontaneous polarization can be detected, the information can be read. The FeRAM has advantages of a low voltage operation and a low power and high-speed writing operation as compared to the flash memory. The system on chip (SOC) used in IC cards and other applications is being developed by combining conventional logic technology with the FeRAM.

The related prior art is disclosed in, for example, Japanese Patent Application Laid-Open Nos. Hei 10-12730, Hei 9-237834, and Hei 2-151032.

Recently, semiconductor devices are integrated into smaller areas at higher densities. A problem with approaching a minimum design rule of 0.18 µm and below is that an interlayer insulating film such as a conventionally used silicon oxide film or the like cannot sufficiently fill in the space between adjacent interconnections, causing the occurrence of voids therebetween.

To improve the gap-fill characteristics of an interlayer insulating film, a high density plasma (HDP) CVD process is proposed, in which a high density silicon oxide film is formed as an interlayer insulating film. The term 'high density' in the term 'high density plasma' here means that a power equal to, or greater than, 1.5 kW is supplied from a low frequency power supply, for example, to an eight-inch wafer. The silicon oxide film formed by this HDP-CVD process can fill in even a narrow space between interconnections, thereby preventing the occurrence of voids.

Similar to other semiconductor devices, FeRAMs are also integrated into smaller areas at higher densities, and accordingly have the same problem as in the case described above. Therefore, a silicon oxide film formed by the HDP-CVD process (hereinafter, referred to as an HDP-CVD oxide film) may possibly be used as an interlayer insulating film for FeRAMs. In the case of FeRAMs, however, their situation is different because silane ($SiH_4$) contained in a source gas is decomposed to generate hydrogen ($H_2$), which is attracted toward the substrate by a low frequency bias voltage applied when such an HDP-CVD oxide film is formed. In the FeRAM, a dielectric film in the capacitor structure comprises a ferroelectric material including $Pb(Zr_{1-x}Ti_x)O_3$, where $0 \leq x \leq 1$, (called PZT) or $(Sr_{1-x}Ba_x)Ta_2O_6$, where $0 \leq x \leq 1$, (called SBT), and such a dielectric film may be easily damaged by hydrogen attracted to the substrate (referred to below as a $H_2$ attack), causing a serious problem in which the capacitor characteristics are severely degraded.

To solve this problem, a method is proposed in which first an HDP-CVD oxide film (a first HDP-CVD oxide film) is formed with a low bias voltage or un-bias and then another HDP-CVD oxide film (a second HDP-CVD oxide film) is formed with a bias voltage higher than the previous one. The first HDP-CVD oxide film has a function of trapping $H_2$, so the $H_2$ generated during the formation of the second HDP-CVD oxide film is trapped therein, thereby preventing the occurrence of the $H_2$ attack.

When this two step HDP-CVD process is performed, however, the space between interconnections is partially filled with the first HDP-CVD oxide film and becomes narrower after the first HDP-CVD oxide film has been formed, and, in addition, the first HDP-CVD oxide film forms a so-called overhang shape at the corner regions of interconnections, so the gap-fill characteristics of the second HDP-CVD oxide film inevitably deteriorate. In this case, to improve the second HDP-CVD oxide film, the bias power must be set to be higher, but this causes the first HDP-CVD film hard to sufficiently trap the $H_2$ and accordingly causes the $H_2$ attack to easily occur. This implies that ensuring the gap-fill characteristics and preventing the $H_2$ attack are in a so-called trade-off relationship. In FeRAMs, performance deteriorations by the $H_2$ attack are a crucial issue, so the developments of technology are currently under way to solve this trade-off problem.

SUMMARY OF THE INVENTION

The present invention addresses the above problem in a semiconductor device having a ferroelectric capacitor structure, and an object of the present invention is to provide a highly reliable semiconductor device and a method of fabricating the same in such a way that the $H_2$ attack is sufficiently prevented without damaging the function of an interlayer insulating film covering interconnections and the like to secure a high capacitor performance.

A semiconductor device according to the present invention comprises: a substrate; a capacitor structure formed above the substrate, having a dielectric film comprising a ferroelectric material and being sandwiched between a bottom electrode and a top electrode; an interconnection layer formed above the capacitor structure, having a plurality of interconnections, at least a part of which is connected to the capacitor structure; and an upper interlayer insulating film comprising a high density plasma dielectric material and covering the interconnection layer, wherein the upper interlayer insulating film includes voids formed between the interconnections disposed adjacently to each other, at lower positions than the positions of the interconnections.

A method of fabricating a semiconductor device according to the present invention comprises the steps of: forming a capacitor structure above a semiconductor substrate, the capacitor structure having a dielectric film comprising a ferroelectric material and being sandwiched between a bottom electrode and a top electrode; forming an interconnection layer having a plurality of interconnections above the capacitor structure so as to connect at least a part of the interconnection layer with the capacitor structure; and forming an upper interlayer insulating film comprising a high density plasma dielectric material so as to cover the interconnection layer, wherein the formation of the upper interlayer insulating film is controlled so that voids are formed between the interconnections disposed adjacently to each other at lower positions than the positions of the interconnections.

According to the present invention, in a semiconductor device having a ferroelectric capacitor structure, the $H_2$ attack is sufficiently prevented without damaging the function of an interlayer insulating film covering interconnections and the like to ensure a high capacitor performance, thereby obtaining a highly reliable semiconductor device.

DETAILED DESCRIPTION OF THE PREFERRED EMBODIMENTS

Outline of the Invention

As described above, ensuring the gap-fill characteristics and preventing the $H_2$ attack are in a trade-off relationship. In FeRAMs, performance deteriorations by the $H_2$ attack are a crucial issue, so preventing the $H_2$ attack is the first priority. The inventor focuses on ensuring the gap-fill characteristics, which is the other side of the trade-off, on the assumption that the $H_2$ attack is prevented. When the gap-fill characteristics deteriorate, one of main problems is that unexpected voids occur, for example, in the space between adjacent interconnections and are exposed to the surface during a surface planarization process performed by, for example, a chemical mechanical polishing (CMP) method after an interlayer insulating film has been formed.

If this is the case and locations of the occurrence, sizes, and shapes of the voids can be controlled, it is not important to especially completely prevent the voids. Further, in FeRAMs, if voids having appropriate sizes are present in the lower inside of an interlayer insulating film, moisture and hydrogen are blocked by the voids and prevented from diffusing into the capacitor structure located in the lower layers, which contributes to preventing the performance deteriorations by the $H_2$ attack, which is the most crucial issue for FeRAMs.

As described above, the present invention deals with the voids occurring in an interlayer insulating film rather positively and controls their sizes, shapes, and locations of the occurrence. Specifically, the insulating film is formed by an HDP-CVD process on the condition that voids are formed in the space between interconnections at lower positions than the positions of the interconnections, the voids having small sizes comparable to the space and simple and substantially sphere shapes or egg shapes not having projection parts reaching the height of the interconnections. This HDP-CVD process is referred to below as an air-gap process.

As a method to realize this control, the present invention uses an HDP-CVD system in which a substrate support plate on which a semiconductor substrate is mounted is movable in the vertical direction in the chamber. The inventor has found that the density of a high density plasma dielectric material becomes higher as the semiconductor substrate is positioned more upward in the chamber (closer to the excited plasma). Using this fact, the position of the semiconductor substrate mounted on and secured to the substrate support plate is adjusted in the vertical direction in the chamber to control the occurrence of the voids.

Figure 1A:
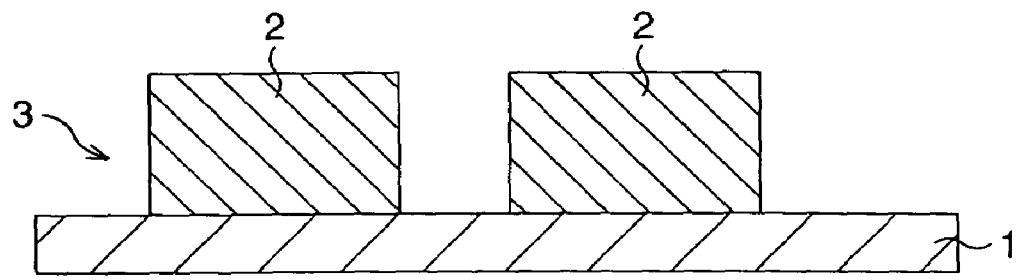
FIGS. 1A to 1C are schematic cross-sectional views showing an example of the air-gap process according to the present invention.
Figure 1B:
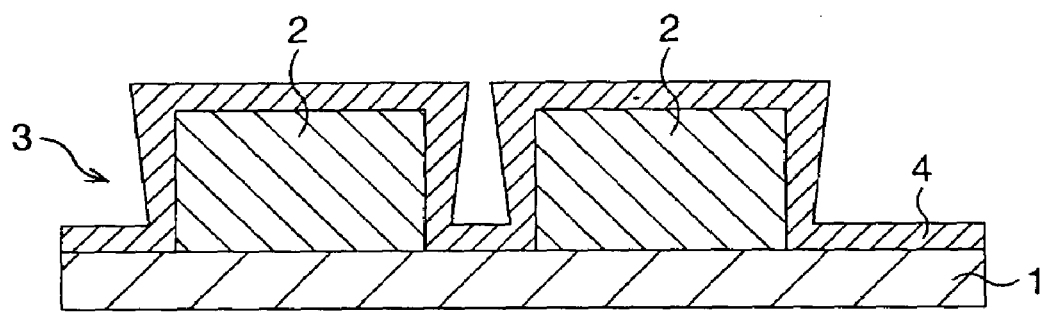
Figure 1C:
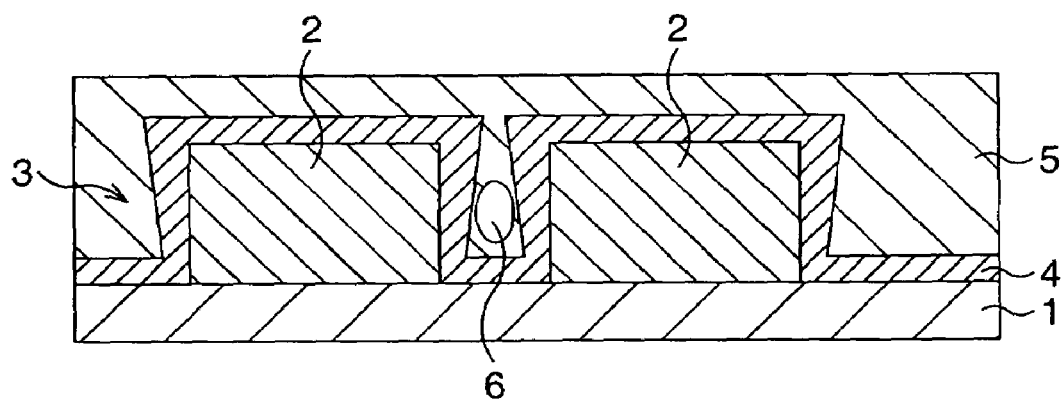

FIGS. 1A, 1B, and 1C illustrate an example of the air-gap process of the invention.

First, as shown in FIG. 1A, after transistor structures and capacitor structures have been formed, an interconnection layer 3 is formed, in which aluminum (Al) interconnections 2 are patterned and formed. For convenience of illustration, lower layer structures below the interconnection layer 3, including the transistor structures and capacitor structures, are illustrated together as a lower layer 1.

Next, as shown in FIG. 1B, a first HDP-CVD oxide film 4 is formed by an HDP-CVD method with a low bias or un-bias.

Subsequently, as shown in FIG. 1C, a second HDP-CVD oxide film 5 is formed so as to fill in the space between the Al interconnections 2. As described above, the second HDP-CVD oxide film 5 is formed so that voids 6 are formed between the Al interconnections 2 so as not to exceed the height of the Al interconnections 2 by adjusting the position of the semiconductor substrate mounted on and secured to the substrate support plate in the vertical direction in the chamber of the HDP-CVD system.

Allowing voids to occur even under such conditions means that a process margin for forming an interlayer insulating film by an HDP-CVD process widens. Specifically, the following advantages are obtained.

(1) Even when an interlayer insulating film is formed by the two layers, i.e., the first HDP-CVD oxide film formed with a low bias or un-bias and the second HDP-CVD oxide film formed with a high bias, as described above, the invented air-gap process can reduce the requirements for the gap-fill characteristics to a level in which voids are conditionally allowed to occur, so the first HDP-CVD oxide film can be made thicker to improve its function of trapping $H_2$.

(2) It is known that the capacitor characteristics are improved by increasing the content ratio of $O_2$ in a mixed gas of $SiH_4$, $O_2$, and Ar, which is a source gas in an HDP-CVD process. For example, although the source gas normally contains $SiH_4$, $O_2$, and Ar with a content ratio of about 1:2:2, making the content ratio of $O_2$ to $SiH_4$ equal to, or more than, 5 is effective. A disadvantage with this, however, is that the gap-fill characteristics of an interlayer insulating film deteriorate. If the invented air-gap process is applied to this case, since the requirements of the gap-fill characteristics are reduced to a level in which voids are conditionally allowed to occur, the capacitor characteristics can be further improved.

(3) It is known that forming a metal compound film selected from among, for example, Al oxide, Al nitride, Ta oxide, Ta nitride, Ti oxide, and Zr oxide in place the first HDP-CVD oxide film or before forming the first HDP-CVD film prevents $H_2$ from diffusing into the capacitor structures in the lower layer. A disadvantage with forming this hydrogen diffusion prevention film, however, is that the gap-fill characteristics of an interlayer insulating film deteriorate. Therefore, if the invented air-gap process is applied to this case, since the requirements of the gap-fill characteristics are reduced to a level in which voids are conditionally allowed to occur, there is no problem if the hydrogen diffusion prevention film is formed in addition to the first HDP-CVD oxide film, so the capacitor characteristics are further improved.

Forming voids in an interlayer insulating film can also adjust the dielectric constant of the interlayer insulating film.

When Cu or an alloy thereof is selected as an interconnection material and filled in the grooves formed in an interlayer insulating film to form the Cu interconnections by a so-called damascene method, a low dielectric constant material is effectively used for the interlayer insulating film. The low dielectric constant materials effectively used in FeRAMs include an HDP-FSG film which is a fluorine-containing film having a low hydrogen concentration and a so-called low-κ film. If the invented air-gap process is applied using a mixed gas of $SiF_4$, $O_2$, and Ar as a source gas, an interlayer insulating film with a low dielectric constant can be formed while ensuring high capacitor characteristics.

Although the laid-open patent references listed above disclose the methods of forming voids between interconnections when an interlayer insulating film is formed, they focus on adjusting, for example, the dielectric constant of the interlayer insulating film. The invented method, however, to address an inherent problem with FeRAMs having ferroelectric capacitor structures, focuses on an interlayer insulating film used for insulating, for example, the interconnections formed in an upper layer above the ferroelectric capacitor structures (and ferroelectric capacitor structure themselves), and controls the formation positions and sizes of voids occurring in the space between the interconnections. The patent references listed above do not describe a FeRAM, and do not disclose or suggest a method of controlling voids as in the present invention.

Embodiment of the Invention

As an embodiment of the present invention, the structure of a ferroelectric memory and its fabrication method will now be described with reference to the attached drawings, FIGS. 2A through 4B which are schematic cross-sectional views showing the fabrication method of the ferroelectric memory according to the present embodiment in the order of process steps.

Figure 2A:
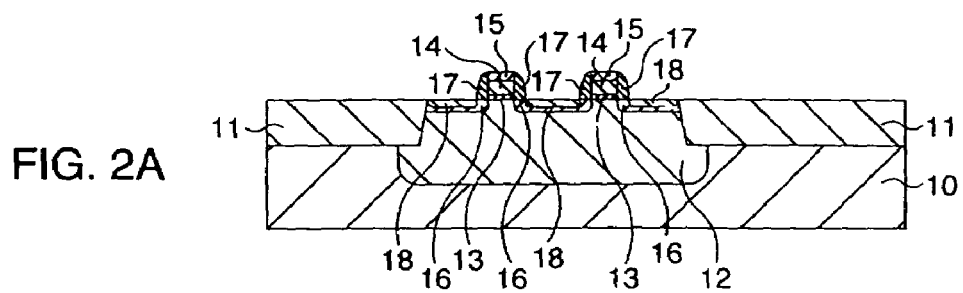
FIGS. 2A to 2E are schematic cross-sectional views showing a method of fabricating a ferroelectric memory according to the invention in the order of process steps.

First, as shown in FIG. 2A, a MOS transistor 20, which functions as a selection transistor, is formed in a silicon semiconductor substrate 10.

Specifically, element isolation structures 11 are formed on the surface of the silicon semiconductor substrate 10 by, for example, a shallow trench isolation (STI) method to define element active regions.

Next, impurities of, for example, boron ions ($B^+$) are implanted into the element active region with a dose of $1\times10^{13}/cm^2$ and an acceleration energy of 300 keV to form a well 12.

Next, thin gate insulating films 13 having a thickness of about 3 nm are formed in the element active region by, for example, thermal oxidation. Subsequently, a polysilicon film having a thickness of about 180 nm and, for example, a silicon nitride film having a thickness of about 30 nm are deposited on the gate insulating film 13 by a CVD method. Then, lithography and subsequent dry etching processes are performed on the silicon nitride film, the polysilicon film, and the gate insulating film 13 to form electrode shapes, whereby the patterns of gate electrodes 14 are formed on the gate insulating film 13. At the same time, the patterns of cap films 15 comprising the silicon nitride film are also formed on the gate electrode 14.

Next, using the cap films 15 as a mask, impurities of, for example, arsenic ions ($As^+$) are implanted into the element active region with a dose of $1\times10^{13}/cm^2$ and an acceleration energy of 10 keV to form a so-called LDD region 16.

Next, a silicon oxide film, for example, is deposited on the entire surface by a CVD method and then etched in a so-called etch-back process, so that the silicon oxide films remain only on the sidewalls of the gate electrode 14 and the cap film 15 to form sidewall insulating films 17.

Next, using the cap films 15 and the sidewall insulating films 17 as a mask, impurities of, for example, phosphorous ions ($P^+$) are implanted into the element active region so as to become higher density than the impurity density in the LDD region 16, for example, with a dose of $1\times10^{15}/cm^2$ and an acceleration energy of 15 keV, whereby a source and drain region 18 overlapping with the LDD region 16 is formed, completing the MOS transistor 20.

Figure 2B:
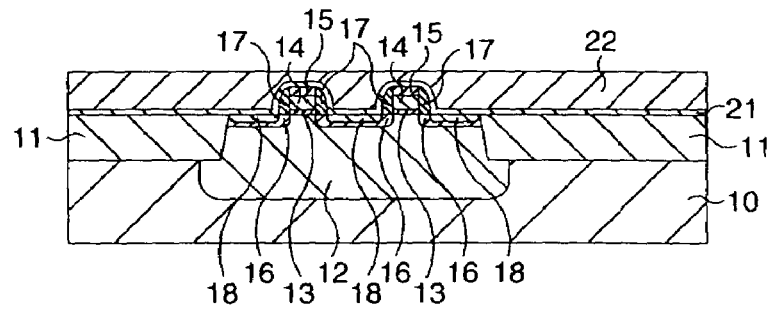

Subsequently, as shown in FIG. 2B, a protection film 21 for the MOS transistor 20 and a first interlayer insulating film 22 are formed.

Specifically, the protection film 21 and the first interlayer insulating film 22 are sequentially deposited so as to cover the MOS transistor 20. The protection film 21 is made of a silicon nitride film and deposited with a thickness of about 70 nm by a CVD method. The first interlayer insulating film 22 has a multi-layer structure, which is formed in such a way that, for example, a plasma SiO film (about 20 nm thickness), a plasma SiN film (about 80 nm thickness), and a plasma TEOS film (about 1000 nm thickness) are sequentially deposited and then polished by CMP down to about 700 nm in thickness.

Figure 2C:
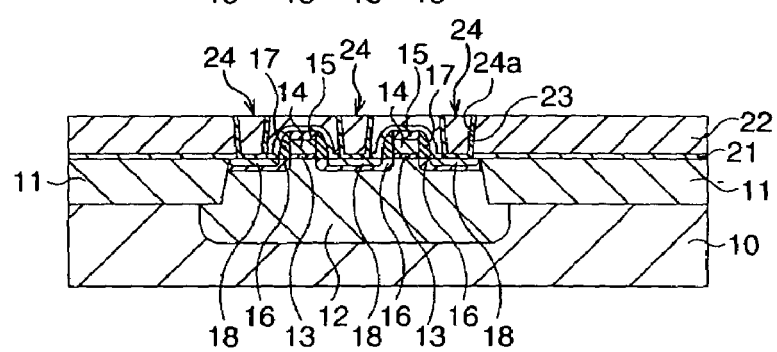

Subsequently, as shown in FIG. 2C, a first plug 24 connected to the source and drain region 18 is formed.

Specifically, the first interlayer insulating film 22 and the protection film 21 are processed by lithography and following dry etching until parts of the surface of the source and drain region 18 are exposed, to form via holes 24a with a hole diameter of, for example, about 0.25 μm.

Next, a Ti film (about 30 nm thickness) and a TiN film (about 20 nm thickness), for example, are deposited by a sputtering method so as to cover the sidewalls of the via holes 24a, thereby forming a foundation film (glue film) 23, and then a tungsten (W) film, for example, is formed by a CVD method so as to fill in the via holes 24a through the glue film 23. After that, the W film and the glue film 23 are polished by CMP using the first interlayer insulating film 22 as a stopper, thereby forming the first plugs 24 in which the via holes 24a are filled with tungsten through the glue film 23.

Figure 2D:
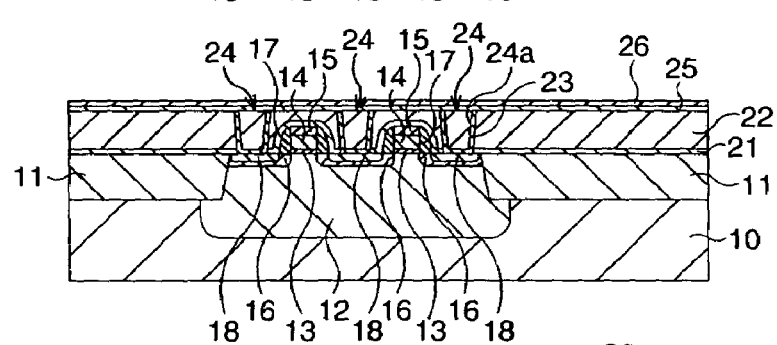

Subsequently, as shown in FIG. 2D, an oxidation protection film 25 for the first plugs 24 and an orientation improvement film 26 for improving the orientation of a bottom electrode, are formed.

Specifically, the oxidation protection film 25 is formed to prevent the first plugs 24 from being oxidized by the thermal annealing in an oxygen atmosphere when the ferroelectric capacitor structures are formed. The oxidation protection film 25 has a multi-layer structure comprising, for example, a SiON film (about 130 nm thickness) and a plasma TEOS film (about 130 nm thickness). The orientation improvement film 26 is made of, for example, a silicon oxide film.

Figure 2E:
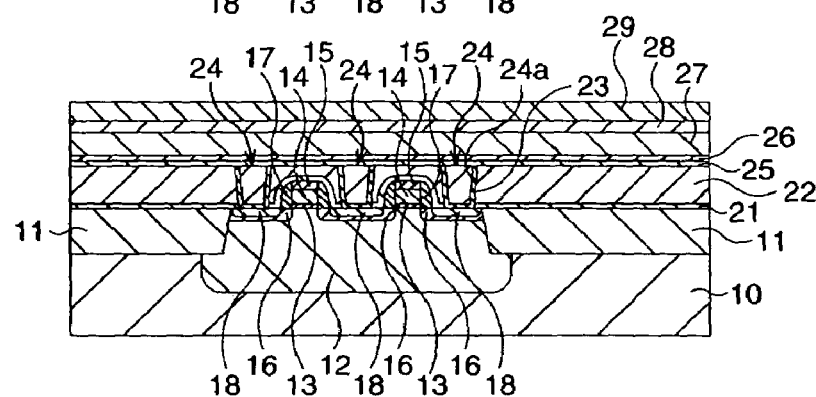

Subsequently, as shown in FIG. 2E, a bottom electrode layer 27, a ferroelectric film 28, and a top electrode layer 29 are sequentially formed.

Specifically, first, a Ti film having a thickness of about 20 nm and a Pt film having a thickness of about 150 nm, for example, are sequentially deposited by a sputtering method to form the bottom electrode layer 27 having a multi-layer structure comprising the Ti film and Pt film. Next, a ferroelectric material including PZT and SBT, for example, the ferroelectric film 28 made of PZT, is deposited on the bottom electrode layer 27 with a thickness of about 200 nm by a radio frequency (RF) sputtering method. Then, an RTA process is performed on the ferroelectric film 28 to crystallize it. Next, the top electrode layer 29 made of, for example, $IrO_2$ of a conductive oxide is deposited on the ferroelectric film 28 with a thickness of about 200 nm by a reactive sputtering method. In place of $IrO_2$, the top electrode layer 29 may also be made of Ir, Ru, $RuO_2$, $SrRuO_3$, or other conductive oxide, or may be formed by a multi-layer structure of these materials.

Figure 3A:
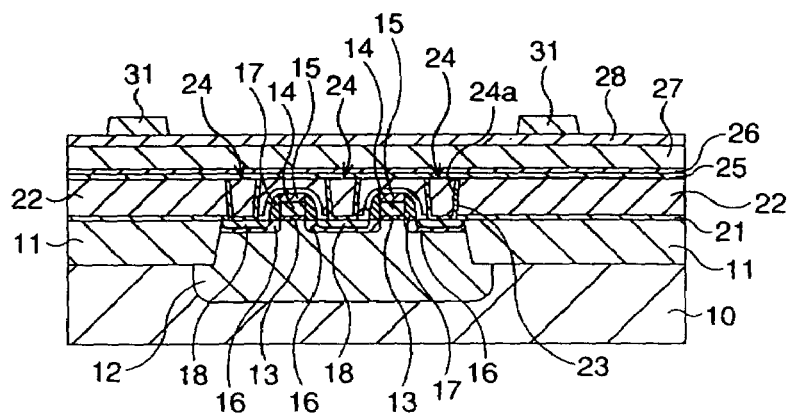
FIGS. 3A to 3D are schematic cross-sectional views showing the method of fabricating the ferroelectric memory according to the invention in the order of process steps following the step in FIG. 2E.

Subsequently, as shown in FIG. 3A, the patterns of top electrodes 31 are formed.

Specifically, the top electrode layer 29 is processed by lithography and following dry etching to form a plurality of electrode shapes, thereby forming a plurality of patterns of the top electrodes 31. At this time, it is effective to perform annealing to recover damages received by the ferroelectric film 28 when the top electrode layer 29 is patterned. The annealing is performed, for example, at a temperature of 650° C. in an oxygen atmosphere for 60 minutes.

Figure 3B:
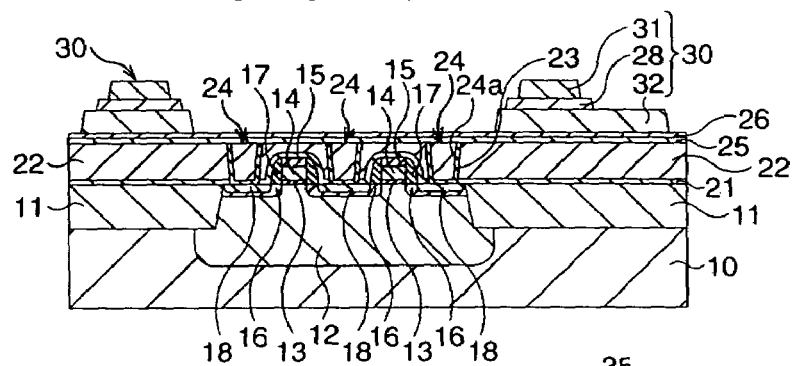

Subsequently, as shown in FIG. 3B, the ferroelectric film 28 and the bottom electrode layer 27 are processed to form ferroelectric capacitor structures 30.

Specifically, first, the ferroelectric film 28 is processed by lithography and following dry etching so as to become sizes slightly larger than the corresponding top electrodes 31.

Next, the bottom electrode layer 27 is processed by lithography and following dry etching so as to become sizes slightly larger than the corresponding processed ferroelectric films 28, thereby forming the patterns of the bottom electrodes 32. The ferroelectric film 28 and the top electrode 31 are thus sequentially stacked on the bottom electrode 32, thereby completing the ferroelectric capacitor structure 30 in which the bottom electrode 32 is capacitively coupled with the top electrode 31 through the ferroelectric film 28.

Figure 3C:
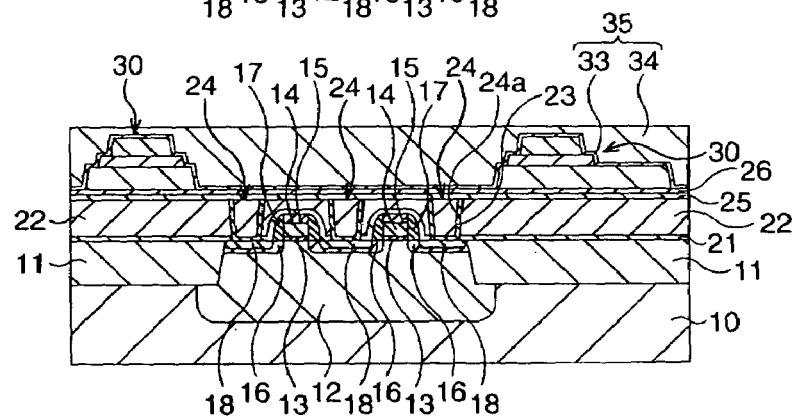

Subsequently, as shown in FIG. 3C, a second interlayer insulating film 35 is formed by an HDP-CVD method.

Specifically, first and second HDP-CVD oxide films 33 and 34 are stacked by an HDP-CVD method so as to cover the ferroelectric capacitor structures 30, thereby forming the second interlayer insulating film 35.

The first HDP-CVD oxide film 33 is formed with a thickness of about 50 nm by an HDP-CVD method with a low bias or un-bias.

The second HDP-CVD oxide film 34 is formed under the following conditions: the bias power is set to a higher level than the one used when the first HDP-CVD oxide film 33 is formed, for example, set to about 2.4 kW; the process temperature is in the range of 175° C. to 400° C., for example, set to 250° C.; a mixed gas of $SiH_4$, $O_2$, and Ar is used as a source gas, wherein a content ratio of these is set to, for example, 1:7.5:6; and a flow rate of the source gas is set to, for example, 70 sccm. The second HDP-CVD oxide film 34 is formed with a thickness of about 1500 nm. In place of a single layer of the second HDP-CVD oxide film 34, a double layer may be used in which a plasma TEOS-SiO film is formed with a thickness of about 800 nm after the second HDP-CVD oxide film 34 has been formed with a thickness of about 700 nm.

Figure 6:
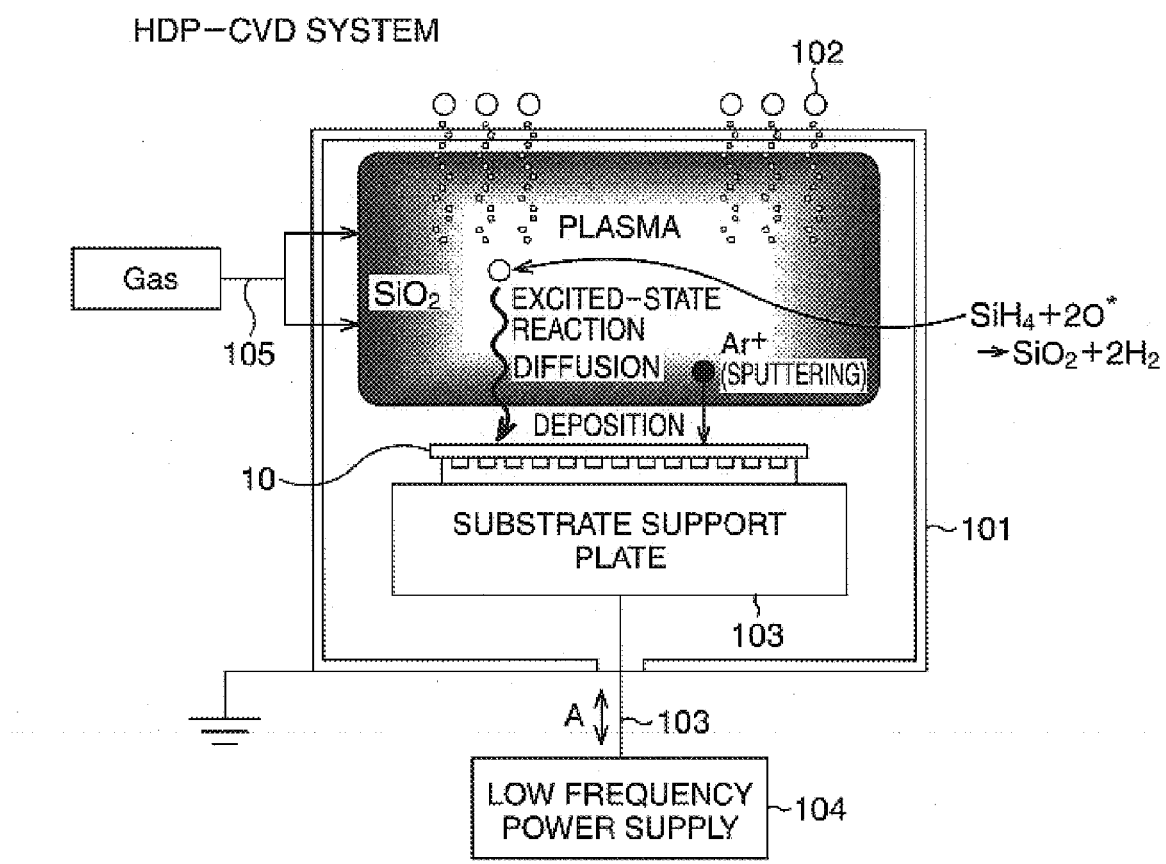
FIG. 6 is a schematic view showing the structure of an HDP-CVD system used in the invention.

The structure of an HDP-CVD system used in the present embodiment is schematically illustrated in FIG. 6.

The HDP-CVD system comprises: a CVD chamber 101; a high frequency antenna 102 wound around the CVD chamber 101, formed in a coil shape; a substrate support plate 103 on which a semiconductor substrate 10 is mounted and secured in the CVD chamber 101; a low frequency power supply 104 for applying a low frequency bias with a predetermined power to the semiconductor substrate 10 through the substrate support plate 103; a source gas supply mechanism 105 for supplying a source gas into the CVD chamber 101; and a pumping mechanism (not shown) for pumping down the CVD chamber 101.

The high frequency antenna 102 receives a high frequency voltage of, for example, 13.56 MHz and is used for generating and exciting high-density plasma in the CVD chamber 101.

The substrate support plate 103 is provided with an electrostatic chuck mechanism by which the semiconductor substrate 10 is mounted and secured. The substrate support plate 103 is further provided with an vertical driving mechanism 103a that enables the substrate support plate 103 to move in the vertical direction in the CVD chamber 101 as indicated by an arrow A in FIG. 6. The distance between the excited plasma and semiconductor substrate 10 mounted on and secured to the substrate support plate 103 can be varied by the operation of the vertical driving mechanism 103a. The vertical driving mechanism 103a can thus adjust the position of the semiconductor substrate 10 mounted on and secured to the substrate support plate 103 in the vertical direction in the CVD chamber 101, thereby controlling the formation of voids. As the semiconductor substrate 10 is set more upward in the CVD chamber 101 so as to be closer to the excited plasma, voids occurring inside the film can be made smaller in size and more spherical (egg-like) in shape. In the embodiment, the controlling of voids is mainly practiced in the formation of an interlayer insulating film for the upper layer interconnections described later.

The low frequency power supply 104 supplies a low frequency bias voltage, e.g., a voltage at 4 MHz, to the semiconductor substrate 10 mounted on and secured to the substrate support plate 103. The decomposed products in the excited high density plasma of source gases are thereby attracted to the semiconductor substrate 10.

Next, after the surface of the formed second interlayer insulating film 35 has been planarized by CMP, to dehydrate the second interlayer insulating film 35 and improve the film quality thereof, a plasma treatment is performed using $N_2$ or $N_2O$ gas at a temperature in the range of 200° C. to 450° C., for example, at 350° C. If the temperature is lower than 200° C., sufficient dehydration and improvement of the film quality cannot be achieved, whereas, if the temperature is higher than 450° C., there is concern that it will adversely affect the ferroelectric capacitor structures 30.

Figure 3D:
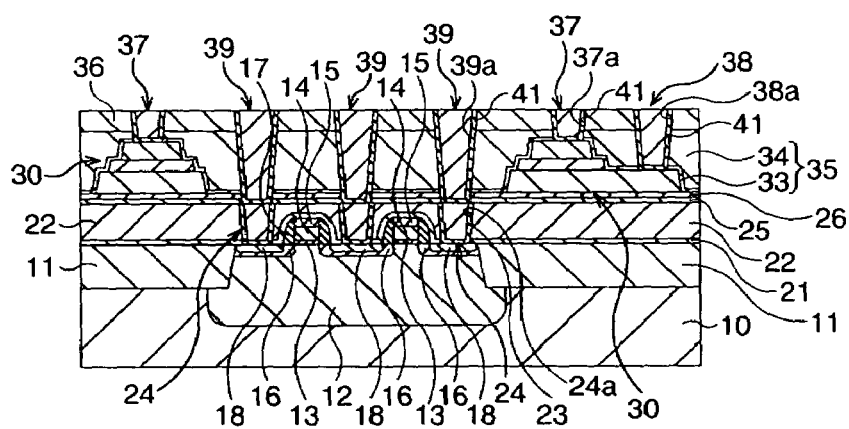

Subsequently, as shown in FIG. 3D, after an oxide film 36 has been formed so as to cover the second interlayer insulating film 35, plugs 37 and 38 of the ferroelectric capacitor structure 30 and second plugs 39 connected to the first plugs 24 are formed. As the oxide film 36, a plasma TEOS film, for example, is deposited with a thickness of about 300 nm.

First, via holes 37a and 38a reaching the ferroelectric capacitor structure 30 are formed.

Specifically, using the same lithography and following dry etching, one process is performed on the oxide film 36 and the second interlayer insulating film 35 until a part of the surface of the top electrode 31 is exposed, and simultaneously the other process is performed on the oxide film 36 and the second interlayer insulating film 35 until a part of the surface of the bottom electrode 32 is exposed, thereby simultaneously forming the via holes 37a and 38a both having a diameter of, for example, about 0.2 μm. When these via holes 37a and 38a are formed, the top electrode 31 and bottom electrode 32 are used as etching stopper layers, respectively.

Next, an annealing treatment is carried out to recover damages received by the ferroelectric capacitor structures 30 during various processes after the ferroelectric capacitor structures 30 have been formed. The annealing treatment is carried out, for example, at a temperature of 500° C. in an oxygen atmosphere for 60 minutes.

Next, via holes 39a reaching the first plugs 24 are formed.

Specifically, the oxide film 36, the second interlayer insulating film 35, the orientation improvement film 26, and the oxidation protection film 25 are processed by lithography and following dry etching using the first plugs 24 as an etching stopper until parts of the surfaces of the first plugs 24 are exposed, thereby forming the via holes 39a with a diameter of, for example, about 0.2 μm.

Next, plugs 37 and 38 and second plugs 39 are formed.

First, after an RF pretreatment equivalent to ordinary oxide film etching of several tens nm, for example, of about 10 nm, has been performed, a TiN film, for example, is deposited with a thickness of about 75 nm by a sputtering method so as to cover the sidewalls of the via holes 37a, 38a, and 39a, thereby forming a foundation film (glue film) 41. Then, a W film, for example, is formed by a CVD method so as to fill in the via holes 37a, 38a, and 39a through the glue film 41. After that, the W film and the glue film 41 are polished by CMP using the oxide film 36 as a stopper to form the plugs 37 and 38 and the second plugs 39 in which the via holes 37a, 38a, and 39a are filled with tungsten (W) through the glue film 41. The first and second plugs 24 and 39 are thus electrically connected with each other to form a so-called via-on-via structure. The via-on-via structure can increase the etching margin for the via hole formation, and reduce the aspect ratio of the via hole.

Figure 4A:
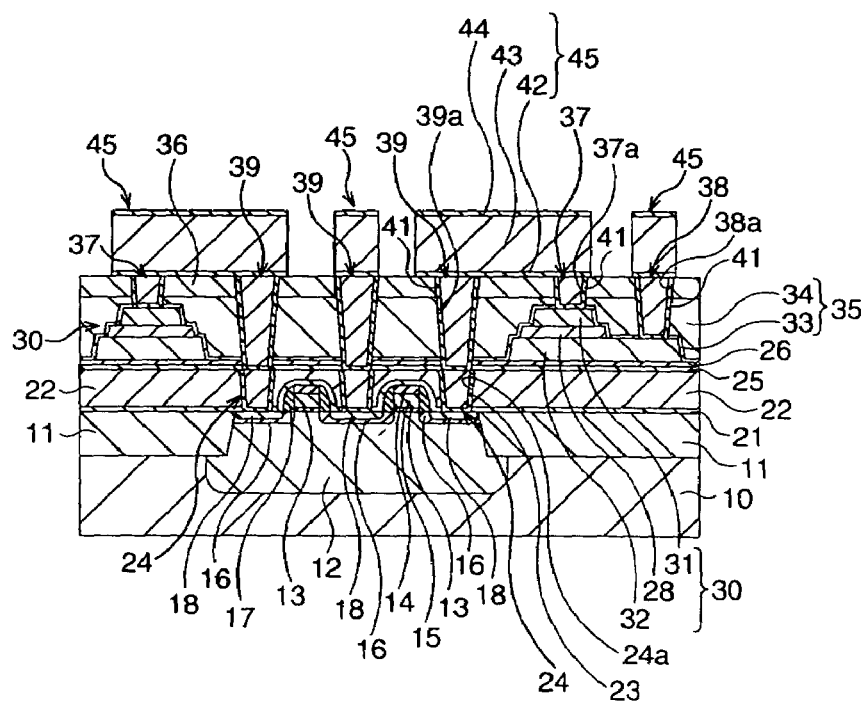
FIGS. 4A and 4B are schematic cross-sectional views showing the method of fabricating the ferroelectric memory according to the invention in the order of process steps following the step in FIG. 3D.

Subsequently, as shown in FIG. 4A, an interconnection layer 45 having interconnections 45a connected to the plugs 37 and 38 and the second plugs 39, respectively, is formed.

Specifically, first, a barrier metal film 42, an interconnection film 43, and another barrier metal film 44 are deposited on the whole area by a sputtering method or other method. As the barrier metal film 42, a Ti film (about 60 nm thickness) and a TiN film (about 30 nm thickness), for example, are sequentially formed by a sputtering method. As the interconnection film 43, an Al alloy film (in this embodiment, an Al—Cu film) is formed with a thickness of about 360 nm. As another barrier metal 44, a Ti film (about 5 nm thickness) and a TiN film (about 70 nm thickness), for example, are sequentially formed by a sputtering method. Since the interconnection film 43 is structured with the same design rule as in the Logic area other than the FeRAM region, there is no issue with interconnection process and reliability.

Next, after an SiON film (not shown), for example, is formed as an anti-reflection film, the anti-reflection film, the barrier metal film 44, the interconnection film 43, and the barrier metal film 42 are processed to interconnection shapes by lithography and following dry etching to form the interconnections 45a, thereby forming the interconnection layer 45 comprising the interconnections 45a. In place of forming an Al alloy film as the interconnection film 43, a Cu film (or a Cu alloy film) may be formed by a so-called damascene method or other method to form Cu interconnections as the interconnections 45a.

Figure 4B:
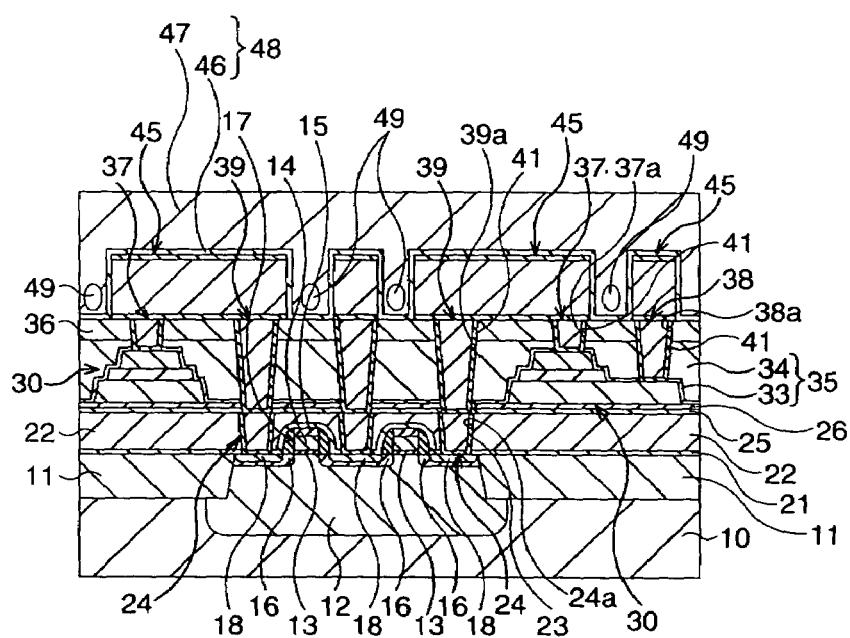

Subsequently, as shown in FIG. 4B, a third interlayer insulating film 48 is formed by using the HDP-CVD system shown in FIG. 6.

Specifically, first and second HDP-CVD oxide films 46 and 47 are stacked by an HDP-CVD method so as to cover the interconnection layer 45 to form the third interlayer insulating film 48.

The first HDP-CVD oxide film 46 is formed with a thickness of about 50 nm by an HDP-CVD method with a low bias or un-bias. Since the first HDP-CVD oxide film 46 is so thin that it cannot completely fill in the space between the interconnections 45a, the surface shape of the first HDP-CVD oxide film 46 mirrors the steps of the interconnections 45a.

The second HDP-CVD oxide film 47 is formed under the following conditions: the bias power is set to a higher level than the one used when the first HDP-CVD oxide film 33 is formed, for example, set to about 2.4 kW; the process temperature is in the range of 175° C. to 400° C., for example, set to 250° C.; a mixed gas of $SiH_4$, $O_2$, and Ar is used as a source gas, wherein a content ratio of these gases is set to, for example, 1:7.5:6; and a flow rate of the source gas is set to, for example, 70 sccm. The second HDP-CVD oxide film 47 is formed with a thickness necessary for burying the interconnections 45a via the first HDP-CVD oxide film 46, for example, a thickness of about 1500 nm. As described above, in the HDP-CVD system shown in FIG. 6, the vertical driving mechanism 103a adjusts the position of the semiconductor substrate 10 mounted and secured to the substrate support plate 103 in the vertical direction in the CVD chamber 101, thereby controlling the formation of voids. In the present embodiment, voids 49 are controlled so as to be formed between the adjacent interconnections 45a in the second HDP-CVD oxide film 47, to have nearly spherical (egg-like) shapes, at lower positions than the height of the interconnections 45a.

Figure 7A:
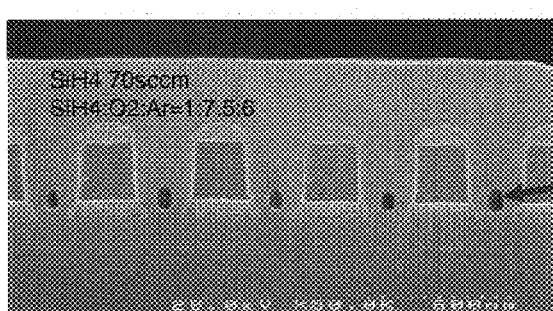
FIGS. 7A to 7D show SEM photographs of the interlayer insulating film actually formed in the above process steps by using the HDP-CVD system shown in FIG. 6.
Figure 7B:
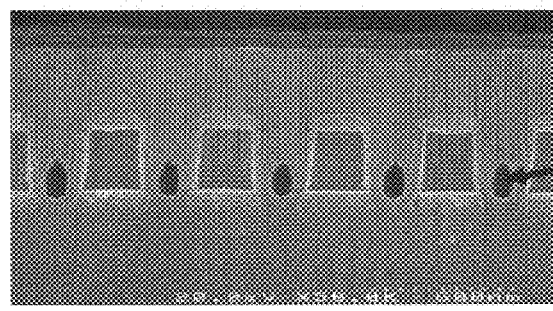
Figure 7C:
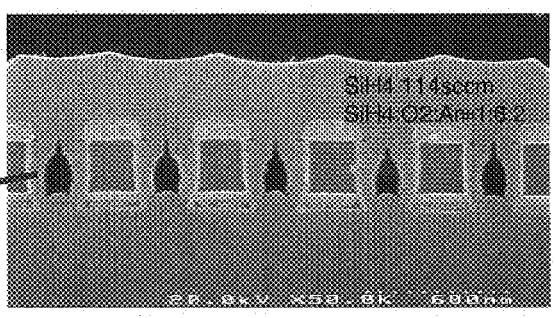
Figure 7D:
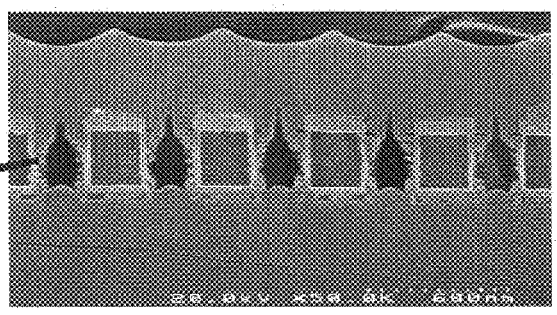

FIGS. 7A, 7B, 7C, and 7D show scanning electron microscope (SEM) photographs of the interlayer insulating film actually formed under the above conditions by using the HDP-CVD system shown in FIG. 6, along with a comparative example. FIGS. 7A and 7B show the embodiment, and FIGS. 7C and 7D show the comparative example, wherein FIGS. 7A and 7C show the central regions of the respective substrates and FIGS. 7B and 7D show the peripheries of the respective substrates. In the comparative example, a conventional HDP-CVD system was used, in which the vertical driving mechanism as shown in FIG. 6 was not provided and the position of the substrate support plate was fixed in the CVD chamber, and SiH$_4$, O$_2$, and Ar were used as a source gas, for example, with a content ratio of 1:6:2 and a flow rate of 114 sccm.

In the comparative example, as shown in FIGS. 7C and 7D, voids occurring in the space between interconnections are relatively large and, in addition, are formed in complex shapes projecting upward, so the interlayer insulating film is seriously damaged. In this case, if the surface of the interlayer insulating film is planarized by CMP, the voids are exposed to the surface, which creates a risk of damaging the function of the interlayer insulating film.

In the embodiment, as shown in FIGS. 7A and 7B, voids occurring in the space between interconnections are significantly small and are formed at lower positions than the height of the interconnection in nearly spherical and simple shapes, so the interlayer insulating film is only lightly damaged. In this case, even if the surface of the interlayer insulating film is planarized by CMP, since the interconnections function as a stopper for the CMP at the worst case, the voids are not exposed to the surface so that the interlayer insulating film can function sufficiently.

Next, after the surface of the formed third interlayer insulating film 48 has been planarized by CMP, to dehydrate the third interlayer insulating film 48 and improve the film quality thereof, a plasma treatment is performed using N$_2$ or N$_2$O gas at a temperature in the range of 200° C. to 450° C., for example, at 350° C. If the temperature is lower than 200° C., sufficient dehydration and improvement of the film quality cannot be achieved, whereas, if the temperature is higher than 450° C., there is concern that it will adversely affect the interconnections 45a.

Figure 5:
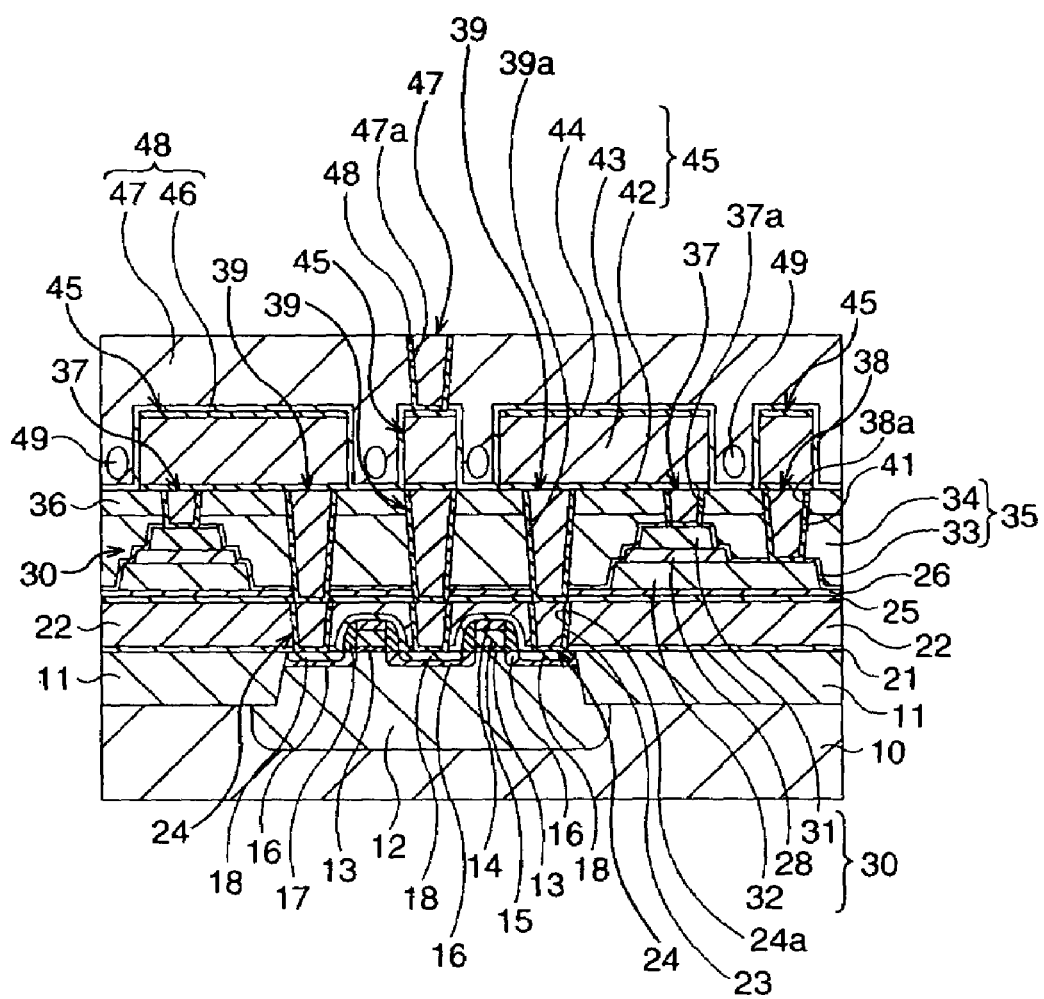
FIG. 5 is a schematic cross-sectional view showing the method of fabricating the ferroelectric memory according to the invention in a process step following the step in FIG. 4B.

Subsequently, as shown in FIG. 5, third plugs 47 are formed, and interconnections and other layers than above third plugs are further formed, thereby completing the FeRAM.

Specifically, the plugs 47 connected to the interconnections 45a are formed.

The third interlayer insulating film 48 is processed by lithography and following dry etching until parts of the surfaces of the interconnections 45a are exposed, thereby forming via holes 47a with a diameter of, for example, about 0.2 μm. Next, a foundation film (glue film) 48 is formed so as to cover the sidewalls of the via holes 47a, after which a W film is formed by a CVD method so that the via holes 47a are filled with the W film through the glue film 48. Subsequently, the W film and the glue film 48 are polished using the third interlayer insulating film 48 as a stopper to form the plugs 47 in which the via holes 47a are filled with tungsten through the glue film 48.

Thereafter, processes for forming upper layer interconnections, interlayer insulating films, and plugs are repeated to form, for example, a five-layer interconnection structure (not shown) including the interconnection layer 45. As in the above cases, these interlayer insulating films are preferably two-layer HDP-CVD oxide films formed while controlling voids by the HDP-CVD system in FIG. 6. After that, first and second cover films (not shown) are formed. In the embodiment, as the first cover film, for example, an HDP-USG film is deposited with a thickness of about 720 nm; as the second cover film, for example, a silicon nitride film is deposited with a thickness of about 500 nm. Further, after contacts for pad leads have been formed on the five-layer interconnection structure, a polyimide film (not shown) is formed and patterned, thereby completing the FeRAM of the embodiment.

In the embodiment, the case has been described in which the air-gap process for controlling the voids 49 is performed in the formation of the second HDP-CVD oxide film 47 when the third interlayer insulating film 48 is formed, but the air-cap process may also be introduced to, for example, the formation of the second interlayer insulating film 35 covering the ferroelectric capacitor structures 30. With the recent reduction in a FeRAM size, if the distance between adjacent ferroelectric capacitor structures 30 is reduced, it is quite conceivable that the gap-fill characteristics in the region therebetween will deteriorate. In this case, if the air-gap process is introduced to control voids, the capacitor characteristics will be further improved, thereby obtaining a highly reliable FeRAM.

When the second and third interlayer insulating films 35 and 48 are formed, in place of the first HDP-CVD oxide films 33 and 46, or before the first HDP-CVD oxide films 33 and 46 are formed, a single film selected from among metal compounds, such as, for example, Al oxide, Al nitride, Ta oxide, Ta nitride, Ti oxide, and Zr oxide, may be formed so as to directly cover the ferroelectric capacitor structure 30 and the interconnection layer 45 thereby preventing H$_2$ from diffusing into the lower layer capacitor structures.

As described above, according to the embodiment, in a FeRAM having the ferroelectric capacitor structures 30, the H$_2$ attack can be sufficiently prevented without damaging the function of, for example, the third interlayer insulating film 48 covering the interconnections 45a, thereby ensuring high performance capacitors and achieving a highly reliable FeRAM.

What is claimed is:

1. A method of fabricating a semiconductor device, comprising the steps of:

forming a capacitor structure above a substrate, the capacitor structure having a dielectric film comprising a ferroelectric material and being sandwiched between a bottom electrode and a top electrode;

forming an interconnection layer having a plurality of interconnections above the capacitor structure so as to connect at least a part of the interconnection layer with the capacitor structure; and forming an upper interlayer insulating film comprising a high density plasma dielectric material so as to cover the interconnection layer wherein the formation of the upper interlayer insulating film is controlled so that voids are formed between the interconnections disposed adjacently to each other at lower positions than the positions of the interconnections.

2. The method of fabricating a semiconductor device according to claim 1, wherein the upper interlayer insulating film is formed while controlling the formation of the voids by means of:

using a high density plasma CVD system that enables a substrate support plate on which the semiconductor substrate is mounted on and secured to move freely in the vertical direction in a chamber;

utilizing a fact that the density of a high density plasma dielectric material to be deposited becomes higher as the semiconductor substrate positions more upward in the chamber; and adjusting the position of the semiconductor substrate mounted on and secured to the substrate support plate in the vertical direction in the chamber.

3. The method of fabricating a semiconductor device according to claim 1, wherein the upper interlayer insulating film is formed by sequentially stacking a first high density plasma dielectric film deposited by using a high density plasma CVD method with a low bias or un-bias, and a second high density plasma dielectric film deposited by using a high density plasma CVD method with a bias higher than the low bias.

4. The method of fabricating a semiconductor device according to claim 1, further comprising the step of forming a hydrogen diffusion preventing film between the interconnection layer and the upper interlayer insulating film.

5. The method of fabricating a semiconductor device according to claim 4, wherein the hydrogen diffusion preventing film is formed of a material selected from the group consisting of aluminum oxide, aluminum nitride, tantalum oxide, tantalum nitride, titanium oxide, and zirconium oxide.

6. The method of fabricating a semiconductor device according to claim 1, further comprising the step of forming a lower interlayer insulating film comprising a high density plasma dielectric material so as to cover the capacitor structure.

7. The method of fabricating a semiconductor device according to claim 6, wherein the lower interlayer insulating film is formed by sequentially stacking a first high density plasma dielectric film deposited by using a high density plasma CVD method with a low bias or un-bias, and a second high density plasma dielectric film deposited by using a high density plasma CVD method with a bias higher than the low bias.

8. The method of fabricating a semiconductor device according to claim 6, further comprising the step of forming a hydrogen diffusion preventing film between the capacitor structure and the lower interlayer insulating film.

9. The method of fabricating a semiconductor device according to claim 6, wherein the lower interlayer insulating film is formed at a temperature in the range of 175° C. to 400° C.

10. The method of fabricating a semiconductor device according to claim 6, further comprising the step of performing a plasma treatment on the lower interlayer insulating film by using $N_2$ or $N_2O$ gas at a temperature in the range of 200° C. to 450° C. after the lower interlayer insulating film has been formed.

11. The method of fabricating a semiconductor device according to claim 1, wherein the dielectric film is formed of PZT or SBT.

12. The method of fabricating a semiconductor device according to claim 1, wherein the upper interlayer insulating film is formed at a temperature in the range of 175° C. to 400° C.

* * * * *